United States Patent
Fu et al.

(10) Patent No.: US 9,484,552 B2
(45) Date of Patent: Nov. 1, 2016

(54) MANUFACTURING METHOD OF FLEXIBLE DEVICE SUBSTRATE

(71) Applicant: Chunghwa Picture Tubes, Ltd., Taoyuan (TW)

(72) Inventors: Hsin-Min Fu, Taoyuan County (TW); Jan-Tian Lian, Keelung (TW); Chia-Sheng Hsieh, Taichung (TW); Hung-Yu Wu, New Taipei (TW); Tzu-Yu Ting, Tainan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 211 days.

(21) Appl. No.: 14/259,158

(22) Filed: Apr. 23, 2014

(65) Prior Publication Data
US 2015/0171030 A1    Jun. 18, 2015

(30) Foreign Application Priority Data

Dec. 17, 2013 (TW) .............................. 102146768 A (51) Int. Cl.
*H01L 27/13* (2006.01)
*H01L 51/52* (2006.01)
*H01L 51/00* (2006.01)

(52) U.S. Cl.
CPC ....... *H01L 51/5253* (2013.01); *H01L 51/0097* (2013.01); *H01L 2924/0002* (2013.01); *Y02E 10/549* (2013.01); *Y02P 70/521* (2015.11)

(58) Field of Classification Search
CPC ............. H01L 23/564; H01L 23/3171; H01L 51/0097; H01L 51/5253; H01L 21/6835; H01L 21/84; H01L 24/03; H01L 27/13; Y02E 10/549

USPC ............ 257/66, E21.703, E27.113; 438/158, 438/197

See application file for complete search history.

(56) References Cited

U.S. PATENT DOCUMENTS

| | | | |
|---|---|---|---|
| 2005/0214984 A1* | 9/2005 | Maruyama | H01L 21/6835 438/149 |
| 2006/0194363 A1 | 8/2006 | Giesberg | |
| 2011/0089811 A1 | 4/2011 | Yamazaki | |
| 2011/0136296 A1* | 6/2011 | Koo | H01L 21/6835 438/106 |
| 2012/0224133 A1* | 9/2012 | Makino | G02F 1/1339 349/153 |
| 2012/0235315 A1 | 9/2012 | Wu | |

FOREIGN PATENT DOCUMENTS

| | | |
|---|---|---|
| CN | 1809918 A | 7/2006 |
| CN | 101916022 A | 12/2010 |
| CN | 102637575 A | 8/2012 |
| TW | I287298 | 9/2007 |
| TW | 201200942 | 1/2012 |
| TW | 201238762 | 10/2012 |
| TW | 201321835 | 6/2013 |

* cited by examiner

*Primary Examiner* — David Vu
*Assistant Examiner* — Mouloucoulaye Inoussa
(74) *Attorney, Agent, or Firm* — Winston Hsu; Scott Margo (57) ABSTRACT

A flexible device substrate includes a flexible substrate, a device layer, and a waterproof layer. The flexible substrate has a top surface and a bottom surface disposed opposite to each other. The device layer is disposed on the top surface of the flexible substrate. The waterproof layer is disposed on the bottom surface of the flexible substrate.

7 Claims, 7 Drawing Sheets

MANUFACTURING METHOD OF FLEXIBLE DEVICE SUBSTRATE

BACKGROUND OF THE INVENTION

1. Field of the Invention

The present invention relates to a flexible device substrate and a manufacturing method thereof, and more particularly, to a flexible device substrate including a waterproof layer disposed on an outer surface of a flexible substrate and a manufacturing method thereof.

2. Description of the Prior Art

Flexible device substrates can be applied to various portable electronic devices, such as flexible display, electronic paper or electronic book because of having characteristics of thin thickness, light weight, flexibility and easily carry.

In traditional manufacturing method of the flexible device substrate, a releasing layer is coated on a rigid substrate first, and then, a flexible substrate is formed on the releasing layer. After the thin-film transistors are formed on the flexible substrate, the flexible substrate can be separated from the releasing layer, and the flexible device substrate is formed. However, the traditional flexible substrate is composed of plastic, so the flexible substrate has worse waterproof ability than glass. In order to prevent mist from entering the thin-film transistors from the flexible substrate, a waterproof layer is formed to cover the flexible substrate before forming the thin-film transistors. Accordingly, there is a waterproof layer disposed between the thin-film transistors formed in the following process and the flexible substrate.

However, since the releasing layer is composed of a material with adhesion and the flexible substrate completely adheres to the releasing layer, the flexible substrate is not easily separated from the releasing layer. When the flexible substrate is separated from the releasing layer, the thin-film transistors on the flexible substrate is also easily damaged by separating stress in the separating process. Or, the releasing layer cannot be separated from the flexible substrate completely, and a part of releasing layer is left on the outside of the flexible substrate, thereby causing the bad flexible device substrate.

SUMMARY OF THE INVENTION

It is an objective of the present invention to provide a flexible device substrate and a manufacturing method to prevent the device layer from being damaged by stress during separating process.

According to an embodiment of the present invention, a flexible device substrate is provided. The flexible device substrate includes a flexible substrate, a device layer, and a waterproof block. The flexible substrate includes a top surface and a bottom surface disposed opposite to each other. The device layer is disposed on the top surface of the flexible substrate. The waterproof block is disposed on the bottom surface of the flexible substrate.

According to an embodiment of the present invention, a manufacturing method of a flexible device substrate is provided. First, a carrier is provided, and the carrier includes a rigid substrate and a releasing layer, wherein the releasing layer covers the rigid substrate. Then, a patterned waterproof layer is formed on the releasing layer, wherein the patterned waterproof layer includes a plurality of waterproof blocks, and a gap is disposed between any two of the waterproof blocks adjacent to each other. After that, a flexible substrate is formed on the patterned waterproof layer and the releasing layer. Next, a device layer is formed on the flexible substrate. Subsequently, a cutting process is performed to separate the waterproof blocks from one another, and each waterproof block is separated from the releasing layer to form a plurality of flexible device substrates.

The manufacturing method of the flexible device substrate in the present invention is to form the patterned waterproof layer between the step of forming the flexible substrate and the step of forming the releasing layer, so that the waterproof block could be easily separated from the releasing layer because of having the hydrophobic characteristic. Accordingly, the device layer would not be damaged in the step of being separated from the releasing layer. Furthermore, the flexible substrate could protect the patterned waterproof layer and the releasing layer from being etched by chemical solutions used in the steps performed on the flexible substrate, and the releasing layer could be avoided losing adhesion in the processes with a high temperature.

DETAILED DESCRIPTION

Figure 1:
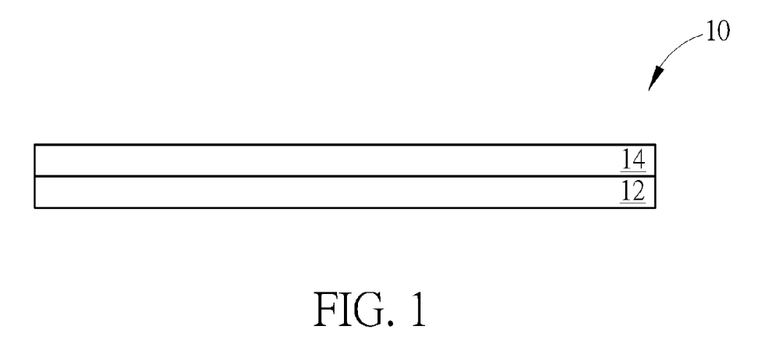
FIG. 1 through FIG. 9 are schematic diagrams illustrating a manufacturing method of a flexible device substrate according to a first embodiment of the present invention.
Figure 2:
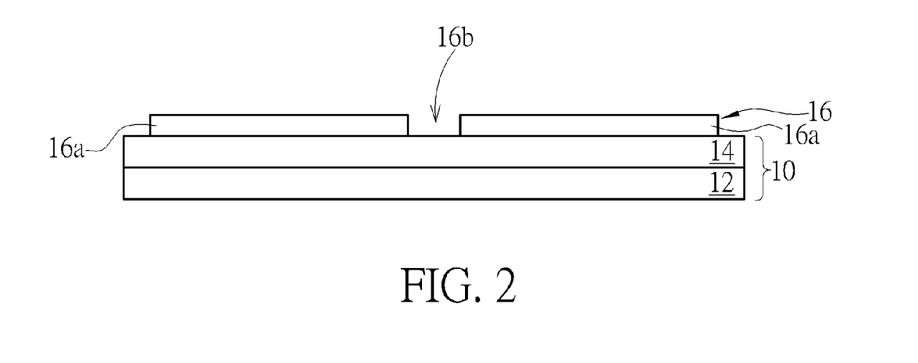
Figure 3:
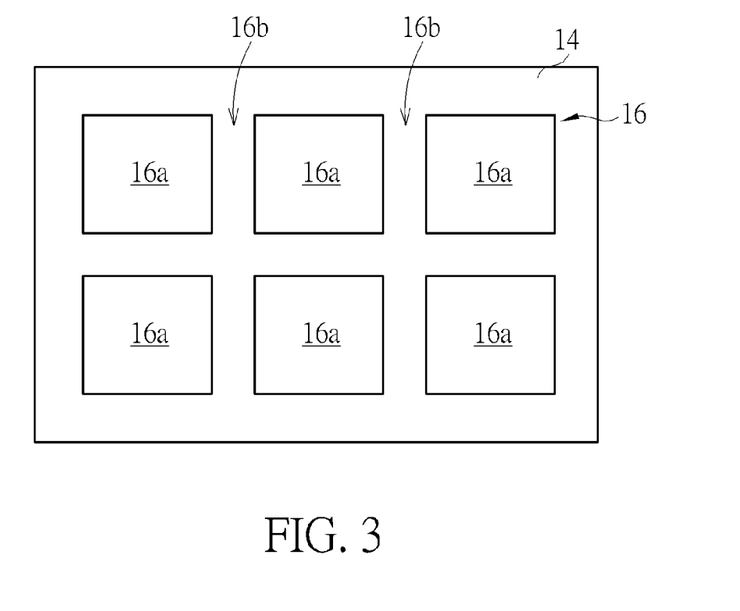
Figure 7:
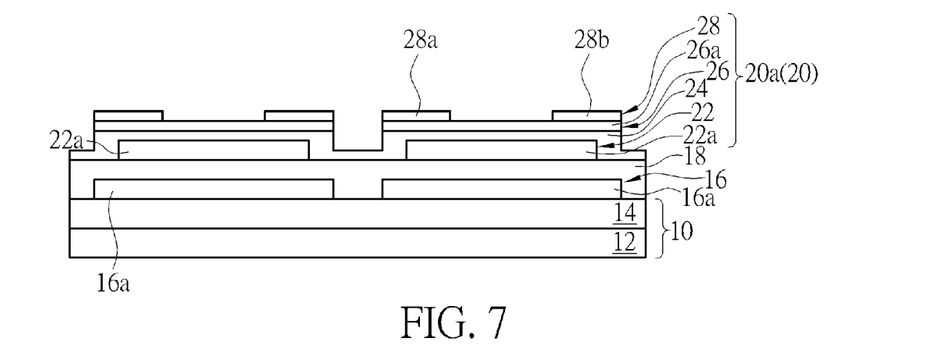
Figure 8:
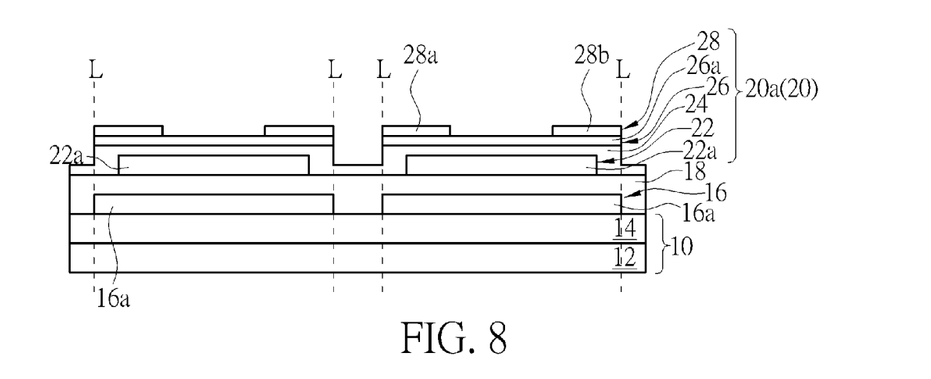
Figure 9:
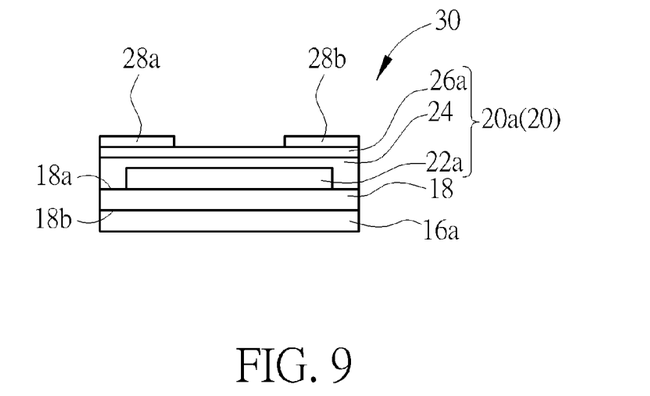

Please refer to FIG. 1 through FIG. 9, which are schematic diagrams illustrating a manufacturing method of a flexible device substrate according to a first embodiment of the present invention, wherein FIG. 3 is a top view illustrating a step of forming a patterned waterproof layer, and FIG. 9 is a schematic diagram illustrating a cross-sectional view of the flexible device substrate according the first embodiment of the present invention. As shown in FIG. 1, a carrier 10 is provided first. The carrier 10 includes a rigid substrate 12 and a releasing layer 14, and then the releasing layer 14 is coated on the rigid substrate and covers the rigid substrate 12. In this embodiment, the rigid substrate 12 may include glass, quartz or other rigid material, so that the rigid substrate 12 can support a flexible substrate and a device layer manufactured in the steps for manufacturing the required flexible device substrate. The releasing layer 14 may be used to combine the flexible device substrate and the rigid substrate 12 in the steps for manufacturing the flexible device substrate, so that the flexible device substrate can be formed stably. A material of the releasing layer 14 may includes epoxy, silicone resin, acrylic ester or other glue material with stickiness, and may be separated with a method, for example being stored in high temperature or low temperature, being irradiated with UV light or being cut with laser, but the present invention is not limited to these methods.

As shown in FIG. 2 and FIG. 3, a patterned waterproof layer 16 is then formed on the releasing layer 14, wherein the patterned waterproof layer 16 includes a plurality of waterproof blocks 16a, and a gap 16b is disposed between any two of the waterproof blocks 16a adjacent to each other, so that the waterproof blocks 16a are not in contact with one another, and the patterned waterproof layer 16 exposes a part of releasing layer 14. In this embodiment, the step of forming the patterned waterproof layer 16 may include performing a screen printing process to directly coat oil on the releasing layer 14 through patterned stencil, so that the patterned waterproof layer 16 can be formed, but the method for forming the patterned waterproof layer 16 of the present invention is not limited to this. In other embodiment, the step of forming the patterned waterproof layer may be include performing a physical vapor deposition process or a chemical vapor deposition process to cover the releasing layer with a waterproof material, and patterning the waterproof material through a lithographic process and an etching process after that, so that the patterned waterproof layer can be formed. Besides, in this embodiment, the patterned waterproof layer 16 may have a hydrophobic characteristic so as to be separated from the releasing layer 14, and may include an organic material, an inorganic material or a mixture thereof. The organic material may include polyacrylonitrile (PAN), PVA, ethylene-vinyl acetate copolymer or Cyclic Olefin Copolymer (COC). The inorganic material may include silicon oxide, silicon nitride or aluminum oxide.

Figure 4:
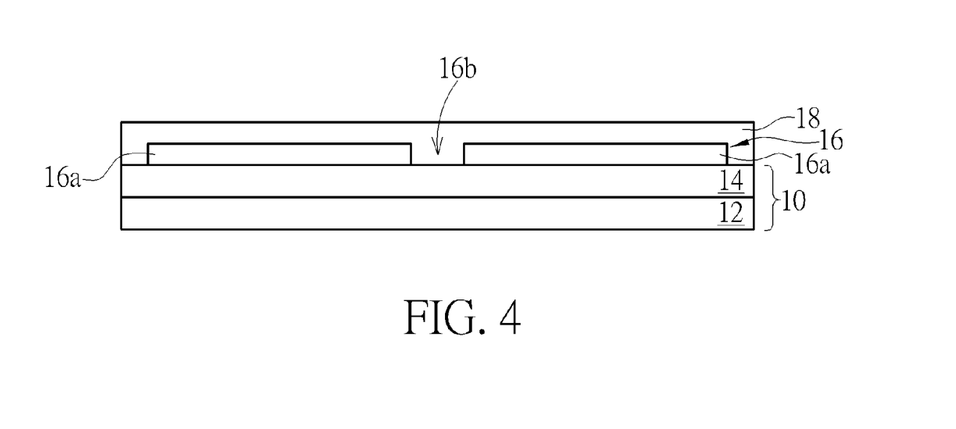

As shown in FIG. 4, after forming the patterned waterproof layer 16, a flexible substrate 18 is formed on the patterned waterproof layer 16 and the exposed releasing layer 14. It should be noted that since the flexible substrate 18 and a part of the releasing layer 14 adhere to each other, the flexible substrate 18 could be stably combined with the carrier 10, and would not be separated from the carrier 10 because the patterned waterproof layer 16 has the hydrophobic characteristic. In this embodiment, the flexible substrate 18 may include polyimide, plastic or other flexible material. Noted that since the flexible substrate 18 completely covers the patterned waterproof layer 16 and the releasing layer 14, the flexible substrate 18 could protect the patterned waterproof layer 16 and the releasing layer 14 from being etched by chemical solutions used in the following processes performed on the flexible substrate 18, and the releasing layer 14 could be avoided losing adhesion in a high temperature.

Figure 5:
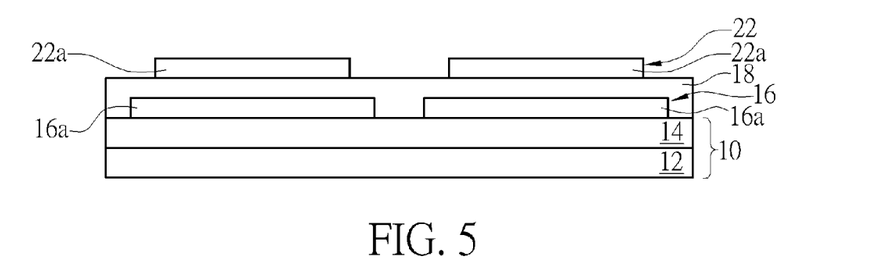
Figure 6:
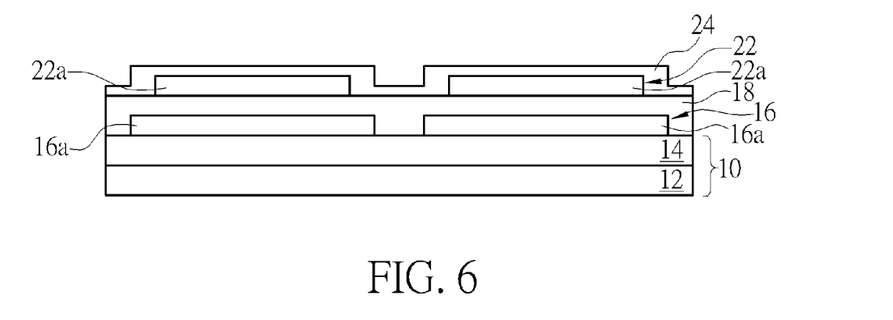

Subsequently, a device layer 20 is formed on the flexible substrate 18. In this embodiment, the device layer 20 includes a thin-film transistor layer 20a. Specifically, the step of forming the device layer 20 is detailed in the following description, and the thin-film transistor layer having one thin-film transistor in one flexible device substrate is taken as an example. Each thin-film transistor layer in the present invention is not limited to have only one thin-film transistor, and may also include a plurality of thin-film transistors and other circuit devices in one flexible device substrate. As shown in FIG. 5, a first patterned metal layer 22 is formed on the flexible substrate 18, and the first patterned metal layer 22 includes a plurality of gate electrodes 22a. As shown in FIG. 6, a gate insulating layer 24 is then formed on the first patterned metal layer 22. After that, as shown in FIG. 7, a patterned semiconductor layer 26 is formed on the gate insulating layer 24, and then a second patterned metal layer 28 is formed on the patterned semiconductor layer 26. The patterned semiconductor layer 26 includes a plurality of semiconductor islands 26a. The second patterned metal layer 28 includes a plurality of source electrodes 28a and a plurality of drain electrodes 28b, and each source electrode 28a and each drain electrode 28b are respectively disposed correspondingly to two sides of each gate electrode 22a. Accordingly, the thin-film transistor layer 20a of this embodiment is completed. The present invention is not limited herein. In other embodiments, the device layer may further include an organic light-emitting diode, a passivation layer or other devices, but not limited herein.

As shown in FIG. 8, after forming the device 20, a cutting process is performed to separate the waterproof blocks from one another along a cutting line L. The cutting line L corresponds to an edge of each waterproof block 16a, so that each waterproof block 16a can be separated into single one. Then, a separating process is performed to separate the waterproof blocks 16a from the releasing layer 14 to form a plurality of flexible device substrate 30 in this embodiment, as shown in FIG. 9. In this embodiment, an area of each waterproof block 16a is the same as an area of the flexible device substrate 30, and each waterproof block 16a is disposed correspondingly to each flexible device substrate 30. Accordingly, when the waterproof blocks are divided, the flexible device substrates 30 are separated, and a part of the flexible substrate 18 adhering to the releasing layer 14 would be cut and removed. The remained releasing layer 14 in contact with each waterproof block 16a would not be combined with the flexible substrate 18. Through the hydrophobic characteristic of the waterproof block 16a, the releasing layer 14 and the rigid substrate 12 can be easily separated from the waterproof block 16a, and the device layer 20 on the flexible substrate 18 would not be damaged in the separating process.

The structure of the flexible device substrate of this embodiment is further detailed in the following description. Please refer to FIG. 9. In this embodiment, the flexible substrate 18 includes a top surface 18a and a bottom surface 18b, and the top surface 18a and the bottom surface 18b are disposed opposite to each other. The device layer 20 includes the thin-film transistor layer, and is disposed on the top surface 18a of the flexible substrate 18. The thin-film transistor layer in this embodiment includes at least one gate electrode 22a, a gate insulating layer 24, at least one semiconductor island 26a, at least one source electrode 28a, and at least one drain electrode 28b. The gate electrode 22a is disposed on the top surface 18a of the flexible substrate 18. The gate insulating layer 24 is disposed on the gate electrode 22a. The semiconductor island 26a is disposed on the gate insulating layer 24. The source electrode 28a and the drain electrode 28b are disposed on the semiconductor island 26a and correspondingly to two sides of the gate electrode 22a. The waterproof block 16a is disposed on the bottom surface 18b of the flexible substrate 18. It should be noted that the waterproof block 16a and the device layer 20 in this embodiment are respectively disposed on the bottom surface 18b and the top surface 18a of the flexible substrate 18 opposite to each other, so that the waterproof block 16a not only avoids the device layer 20 being affected by mist but also easily separate the flexible device substrate 30 from the carrier 10 so as to protect the device layer 20 from being damaged by the separating stress.

The flexible device substrate is not limited by the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 10:
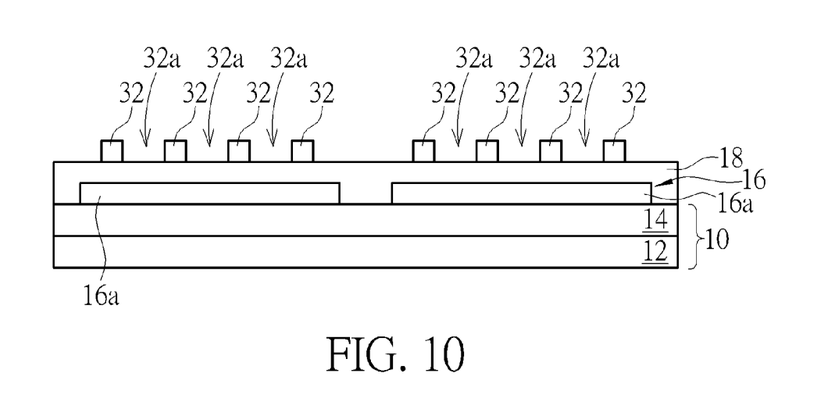
FIG. 10 through FIG. 13 are schematic diagrams illustrating a manufacturing method of a flexible device substrate according to a second embodiment of the present invention.
Figure 11:
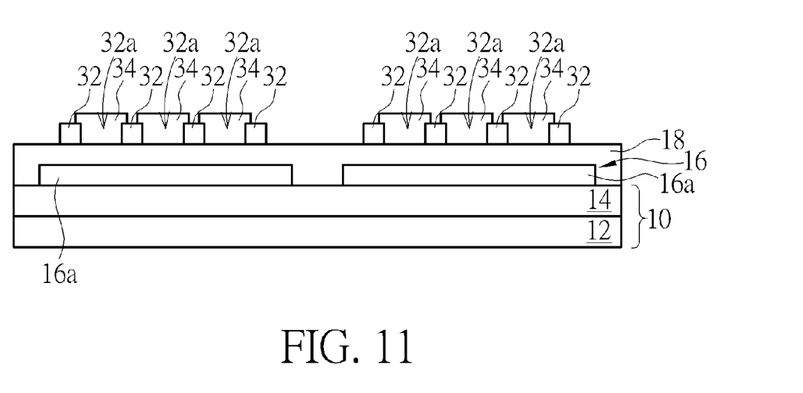
Figure 12:
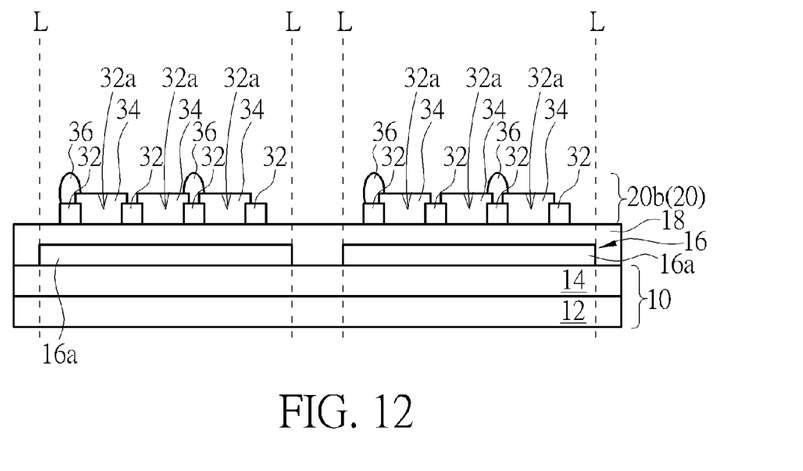
Figure 13:
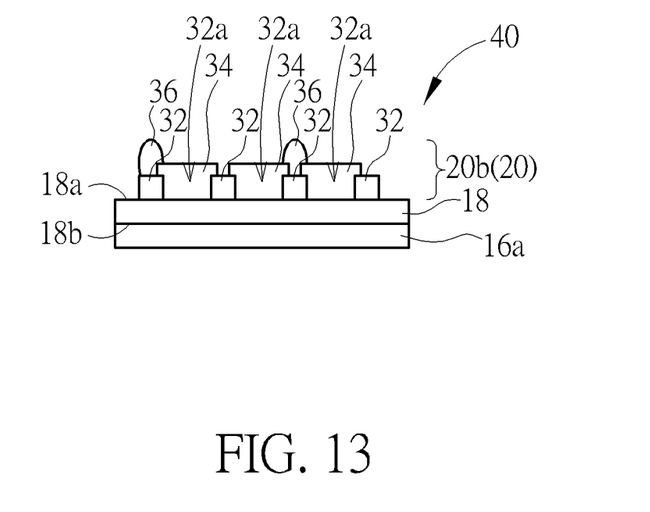

Please refer to FIG. 10 through FIG. 13, which are schematic diagrams illustrating a manufacturing method of a flexible device substrate according to a second embodiment of the present invention. The difference between the manufacturing method of the flexible device substrate in this embodiment and the manufacturing method of the flexible device substrate in the first embodiment is that the formed device layer 20 includes a color filter layer 20b in this embodiment. Furthermore, the steps before the step of forming the device layer in this embodiment are the same as that in the first embodiment, as shown in FIG. 1 through FIG. 4, and are not detailed redundantly. In this embodiment, after forming the flexible substrate 18, a color filter layer 20b is formed on the flexible substrate 18. Specifically, the step of forming the color filter layer 20b is detailed in the following description, and the color filter layer 20b of one pixel region in one flexible device substrate is taken as an example, but the present invention is not limited to this. As shown in FIG. 10, a black matrix layer 32, such as black photoresist, is formed on the flexible substrate 18, and the black matrix layer 32 includes a plurality of openings 32a exposing parts of the flexible substrate 18. As shown in FIG. 11, a plurality of color filters 34 are formed on the flexible substrate in the openings 32a respectively. Each color filter 34 covers the flexible substrate 18 exposed by each opening 32a. The color filters 34 in this embodiment may have different colors, but the present invention is not limited to this. As shown in FIG. 12, a plurality of spacers 36 are then formed on the black matrix layer 32. Accordingly, the color filter layer 20b of this embodiment is completed. The present invention is not limited to this. In other embodiments, the device layer may further include transparent conductive layer or other devices according to the requirements, but not limited herein. In this embodiment, the steps after forming the color filter layer 20b are the same as that in the first embodiment. The steps after forming the color filter layer 20b in this embodiment are performing the cutting process along the cutting line L to separate the waterproof blocks 16a and then performing the separating process to separate the waterproof block 16a and the releasing layer 14 to form a plurality of flexible device substrate 40, as shown in FIG. 13.

As the above-mentioned description, the manufacturing method of the flexible device substrate in the present invention forms the patterned waterproof layer between forming the flexible substrate and forming the releasing layer, so that the waterproof block could be easily separated from the releasing layer because of having the hydrophobic characteristic. Accordingly, the device layer would not be damaged in the step of being separated from the releasing layer. Furthermore, the flexible substrate could protect the patterned waterproof layer and the releasing layer from being etched by chemical solutions used in the steps performed on the flexible substrate, and the releasing layer could be avoided losing adhesion in the processes with a high temperature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a flexible device substrate, comprising following steps:

provideing a carrier, the carrier comprising a rigid substrate and a releasing layer, wherein the releasing layer covers the rigid substrate;

forming a patterned waterproof layer on the releasing layer, wherein the patterned waterproof layer comprises a plurality of waterproof blocks, and a gap is disposed between any two of the waterproof blocks adjacent to each other;

forming a flexible substrate on the patterned waterproof layer and the releasing layer, wherein the flexible substrate and a part of the releasing layer directly adhere to each other through the gap;

forming a device layer on the flexible substrate; and performing a cutting process to separate the waterproof blocks from one another, and separating the waterproof blocks from the releasing layer to form a plurality of flexible device substrates.

2. The manufacturing method of the flexible device substrate according to claim 1, wherein the step of forming the patterned waterproof layer comprises performing a screen printing process.

3. The manufacturing method of the flexible device substrate according to claim 1, wherein the step of forming the patterned waterproof layer comprises a physical vapor deposition process or a chemical vapor deposition process.

4. The manufacturing method of the flexible device substrate according to claim 1, wherein the step of forming the device layer comprises:

forming a first patterned metal layer on the flexible substrate;

forming a gate insulating layer on the first patterned metal layer; and forming a patterned semiconductor layer on the gate insulating layer, and forming a second patterned metal layer on the patterned semiconductor layer.

5. The manufacturing method of the flexible device substrate according to claim 1, wherein the step of forming the device layer comprises:

forming a black matrix layer on the flexible substrate, and the black matrix layer comprising a plurality of openings;

forming a plurality of color filters on the flexible substrate exposed by the openings respectively; and forming a plurality of spacers on the black matrix layer.

6. The manufacturing method of the flexible device substrate according to claim 1, wherein an area of each waterproof block is the same as an area of each flexible device substrate.

7. The manufacturing method of the flexible device substrate according to claim 1, wherein the patterned waterproof layer comprises an organic material, an inorganic material or a combination thereof.

* * * * *